(12) United States Patent
Kaneko et al.

(10) Patent No.: US 6,476,463 B1
(45) Date of Patent: Nov. 5, 2002

(54) MICROWAVE INTEGRATED CIRCUIT MULTI-CHIP-MODULE

(75) Inventors: Tomoya Kaneko, Tokyo (JP); Kenzo Wada, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/320,328

(22) Filed: May 26, 1999

(30) Foreign Application Priority Data

May 28, 1998 (JP) ............................... 10-147745

(51) Int. Cl.[7] .......................................... H01L 23/552
(52) U.S. Cl. ................. 257/660; 257/698; 257/700; 257/724; 257/728; 257/758; 361/752; 361/817; 361/818
(58) Field of Search ................. 257/704, 710, 257/728, 723, 724, 701, 758, 698, 678, 690, 691, 692, 659, 660, 700; 174/52.2, 52.3, 52.4; 361/752, 816, 817, 818

(56) References Cited

U.S. PATENT DOCUMENTS

| 5,418,329 | A | | 5/1995 | Katoh et al. ............... 174/52.3 |
|---|---|---|---|---|
| 5,668,408 | A | | 9/1997 | Nicholson .................... 257/699 |
| 5,717,245 | A | * | 2/1998 | Pedder ........................ 257/691 |
| 6,025,759 | A | * | 2/2000 | Takahashi .................... 333/1.1 |
| 6,057,600 | A | * | 5/2000 | Kitazawa et al. ............ 257/728 |
| 6,140,698 | A | * | 10/2000 | Damphousse et al. ....... 257/704 |
| 6,356,173 | B1 | * | 3/2002 | Nagata et al. ............... 257/728 |

FOREIGN PATENT DOCUMENTS

| EP | 0544329 | 6/1993 |
|---|---|---|
| JP | 1-121939 | 8/1989 |
| JP | 2-21744 | 4/1990 |
| JP | 3-71804 | 11/1991 |
| JP | 5-75314 | 3/1993 |
| JP | 8-78618 | 3/1996 |
| JP | 8-162559 | 6/1996 |
| JP | 9-283649 | 10/1997 |

OTHER PUBLICATIONS

K. Ikuina, et al., "Glass–Ceramic Multichip Module for Satellite Microwave Communications Systems", Proceedings—1995 International Conference on Multichip Modules, Apr. 19–21, 1995, pp. 483–488.
European Office Action issued Jul. 12, 2000 in a related application (in English).
"Efficient Way and Actual practiceof Reliability Acceleration Tests," Yoji Kanuma, pp, 161–165, published Oct. 4, 1997.
Japanese Office Action issued Jul. 19, 2000 in related application with English translation of relevant portions.

* cited by examiner

Primary Examiner—Kamand Cuneo
Assistant Examiner—Alonzo Chambliss
(74) Attorney, Agent, or Firm—Dickstein, Shapiro, Morin & Oshinsky, LLP

(57) ABSTRACT

A package substrate 3 has a high frequency transmission line, which is formed by a high frequency circuit layer 8 formed on the surface, a grounding layer 10b formed thereunder and a dielectric ceramic intervening between the layers 8 and 10b, and also has a plurality of MMICs 14. A lid 18 as a shielding member which electromangetically shields the high frequency transmission line and the MMICs 14 from one another, is bonded to the surface of the package substrate 3. The lid 18a has recesses 18a formed such as to face the high frequency transmission line and the MMICs 14. The surface of the package substrate 3 and the outer periphery of the lid 18 are hermetically sealed together by water-resistant resin. Thus, a step of bonding a shielding member is simplified and the yield of hermetic sealing of the bonded part of the shielding member is improved.

26 Claims, 5 Drawing Sheets

MICROWAVE INTEGRATED CIRCUIT MULTI-CHIP-MODULE

BACKGROUND OF THE INVENTION

The present invention relates to multi-chip-modules, in which a plurality of microwave/millimeterwave integrated circuits (hereinafter referred to as MICs) utilizing electromagnetic waves in the micro-band to milli-band are mounted in a package substrate.

In a prior art multi-chip-module with a plurality of MICs mounted therein, a microwave/millimeterwave transceiving circuit is constructed such that elementary circuits such as amplifiers and oscillators or composite circuits such as ones in which a multiplier and an amplifier are made integral, ones in which a mixer and an amplifier are made integral, and ones in which a transmitting unit or a receiving unit are made integral, are interconnected by metal waveguide circuits or three-dimensional circuits.

Particularly, in a multi-chip-module, a low temperature simultaneous baking substrate such as glass ceramic substrate is used as dielectric substrate, is as low as 3 W/m·K of heat conductivity. To cope with this, a multi-chip-module having heat radiation via holes for promoting heat radiation, is proposed in, K. Ikuina et. al., "Glass-Ceramic Multi-chip-module for Satellite Microwave Communication System", Proc. ICEMCM '95, 1995, pp. 483–488.

However, even in the multi-chip-module proposed in the above treatise, the thermal conductivity is at most several W/m·K, and it is impossible to greatly improve the heat radiation efficiency. Accordingly, a structure in which metal is applied or buried for permitting heat dissipation from a semiconductor chip is provided as a means for improving the heat radiation efficiency.

In the above treatise is also proposed a multi-chip-module having a structure that lids serving as shielding members for shielding high frequency circuits and functional elements from one another are each bonded to a pack,age substrate for each function element constituted by a monolithic MIC such as an oscillator, a mixer, an amplifier and a transceiver.

Heretofore, a ceramic package of the multi-chip-module is connected to a printed circuit board as a mounting substrate by forming solder balls on an electrode pad provided on the ceramic package and connecting the ceramic package via the solder ball to the printed circuit board. This method of connection is called BGA (Ball Grid Array) connection. As another connecting means, the ceramic package is mounted on the printed circuit board by soldering LCC (Leadless Chip Carrier) electrodes provided on the ceramic package to the printed circuit board.

However, in the multi-chip-module, in which the microwave/millimeterwave transceiving circuit is such that elementary circuits and composite circuits are interconnected by metal waveguide circuits and three-dimensional circuits, a drawback occurs in that the metal waveguides is complicated in shape and also such steps as screwing and welding are required for the waveguide formation. This is undesirable from the standpoint of reducing the cost of the multi-chip-module.

In the multi-chip-module, in which metal is applied or buried for dispersing heat from the semiconductor chip, the metal has a thickness of at least 0.2 to 0.5 mm in view of the limit of the processing accuracy, and discontinuity of high frequency grounding surface is produced, thus deteriorating the high frequency characteristics.

In the multi-chip-module, in which lids are each bonded for each function element for electromagnetic shielding and hermetical sealing of function elements from one another, a plurality of lids should be bonded to the package substrate and hermetically sealed. In this bonding step, the yield value of the hermetical sealing is the accumulation of the yield value of the hermetical sealing of one lid by the number of lids mounted on the package substrate, and is therefore very low. In addition, when defective sealing is detected in the bonded part of either one of the lids as a result of a leak test conducted on the completed multi-chip module, it is difficult to determine which one of the lids has the defectively sealed bonded part because of the multiple lid structure of this multi-chip-module.

Furthermore, in the prior art structure, in which the ceramic package of the multi-chip-module is soldered to the printed circuit board, the low linear thermal expansion coefficient of the ceramic substrate, for instance of aluminum nitride, which measures 3.5 to 4.5 ppm/° C., gives rise to the following problem in the connection. When the connection is made by using solder with a linear thermal expansion coefficient of 13 to 16 ppm/° C. (for instance "FR-4", manufactured by Mitsubishi Gas Chemical Co., Ltd.), cracks or fissures are generated in solder bonded parts by working ambient temperature changes, as described in, Yoji Kanuma, "Efficient Way and Actual Practice of Reliability Acceleration Tests", pp. 161–165 published on Oct. 4, 1997. Therefore, it has been impossible to realize a package size larger than 20 mm on one side.

SUMMARY OF THE INVENTION

An object of the present invention is to provide a microwave integrated circuit multi-chip-module, which permits simplification of the step of bonding the shielding member and improving the yield of the hermetical shielding on the bonded part of the shielding member.

Another object of the present invention is to provide a microwave integrated circuit multi-chip-module mounting structure, in which portions connected to the mounting substrate are not readily broken apart by heat generation in the microwave integrated circuit multi-chip-module.

According to an aspect of the present invention, there is provided a microwave integrated circuit multi-chip-module comprising a package substrate having a high frequency transmission line formed on the surface, a plurality of microwave integrated circuits mounted thereon, and a shielding member bonded to the surface of the package substrate and electromagnetically shielding the high frequency transmission line and each microwave integrated circuit from each other, wherein the shielding member has recesses formed such as to face the high frequency transmission line and the microwave integrated circuits and shielding wall portions partitioning the recesses from one another.

In this structure, the high frequency transmission line and each microwave integrated circuit of the microwave integrated circuit multi-chip-module are electromagnetically shielded by a single shielding member,. Thus, the bonding of the shielding member to the package substrate is completed in a single step, thus simplifying the shielding member boding process.

The surface of the package substrate and the outer periphery of the shielding member are hermetically shielded from each other by fillets made of a water-resistant material or a solder. Thus, the yield of the hermetical shielding on the bonded part of the shielding member is improved.

The package substrate has a tubular waveguide part for guiding electromagnetic waves inputted to or outputted from the high frequency transmission line. The waveguide part has a plurality of via holes formed in a predetermined interval in a tubular fashion in the package substrate.

According to another aspect of the present invention, there is provided a mounting structure for mounting a microwave integrated circuit multi-chip-module comprising the microwave integrated circuit multi-chip-module described above, and a mounting substrate with the microwave integrated circuit multi-chip-module mounted therein, wherein the side surfaces of the package module of the microwave integrated circuit module has external connection electrodes connected to the microwave integrated circuits, and the mounting substrate has a receptacle member with the microwave integrated circuit multi-chip-module mounted therein and having flexible connector terminals connected to the external connection electrodes of the microwave integrated circuit multi-chip-module.

In this structure, even when the microwave integrated circuit multi-chip-module expanding due to heat generation in the microwave integrated circuits, the expansion is absorbed by flexing deformation of the connector electrodes, thus improving the reliability of the connection between the microwave integrated circuit multi-chip-module and the mounting substrate.

At least a portion of parts of the mounting substrate and the receptacle member that face the microwave integrated circuit multi-chip-module when the, microwave integrated circuit multi-chip-module is mounted in the receptacle member, has an opening, a projection formed in a support member with the microwave integrated circuit multi-chip-module mounted therein being inserted through the opening. Thus the heat generated in the MMICs is conducted through the projection of the support member to the outside.

According to another aspect of the present invention, there is provided a microwave integrated circuit multi-chip-module comprising a package substrate of a high temperature co-fired ceramic of a dielectric property including a plurality of high frequency circuit portions formed on the surface, and a shielding member of a non-magnetic metal having a plurality of recesses formed in positions corresponding to the respective high frequency circuit portions, the package substrate and the shielding member being bonded for electromagnetically shielding the high frequency circuit portions.

The shielding member is of tungsten and the package, substrate is beryllia or nitride. The package substrate is made of aluminum nitride, beryllia or silicon nitride. The package substrate and the shielding member are bonded together by a conductive adhesive or a solder. The surface of the package substrate and edge of the shielding member are hermetically sealed to one another by fillets of moisture-resistant resin or a solder.

According to still another aspect of the present invention, there is provided a mounting structure for mounting a microwave integrated circuit multi-chip-module comprising a package substrate of a high temperature co-fired ceramic of a dielectric property including a plurality of high frequency circuit portions formed on the surface, a shielding member of a non-magnetic metal having plurality of recesses formed in position corresponding to the respective high frequency circuit portions, the package substrate and a plurality of leadless chip carrier electrodes, the shielding member being bonded for electromagnetically shielding the high frequency circuit portions; and a receptacle having a plurality of flexible connector electrodes each connected to the corresponding leadless chip carrier electrode.

The leadless electrodes are mounted by a solder re-flow on a printed circuit board serving as a mounting board. The leadless electrodes are mounted by a solder re-flow on a printed circuit board as a mounting board and the printed circuit board is secured by a mother board as a support member of a metal. The leadless electrodes is mounted by a solder re-flow on a printed circuit board as a mounting board, the printed circuit board is secured a mother board as a support member of a metal, and the projection of the mother board has a rectangular hole facing rectangular cavity formed in the multi-chip-module functioning as part of the tubular waveguide. The package substrate is made of aluminum nitride, beryllia or silicon nitride. A buffer plate is inserted between the package substrate and the high frequency circuit portion in order to reduce the mechanical stress caused to the high frequency circuit portion due to the difference of the temperature expansion coefficients.

Other objects and features will be clarified from the following description with reference to attached drawings.

PREFERRED EMBODIMENTS OF THE INVENTION

Preferred embodiments of the present invention will now be described with reference to the drawings.

Figure 1:
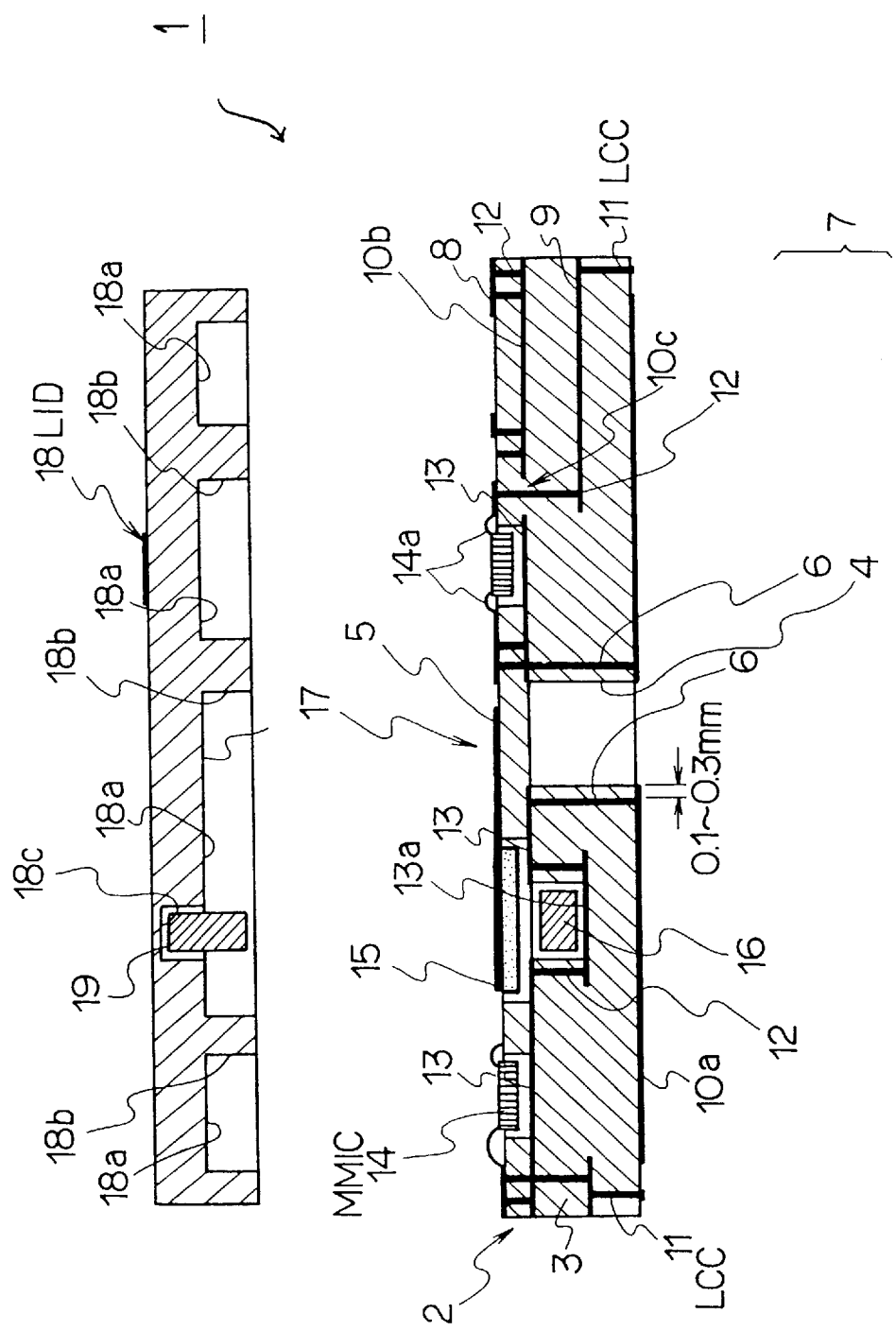
FIG. 1 is a sectional view showing an embodiment of the microwave IC multi-chip -module according to the present invention in a state that an LCC package and a lid of the module are separated from each other.

FIG. 1 is a sectional view showing an embodiment of the microwave IC multi-chip-module according to the present invention in a state that an LCC package and a lid of the module are separated from each other.

As shown in FIG. 1, the microwave IC multi-chip-module (hereinafter referred to as multi-chip-module) 1 comprises an LCC package 2, which is obtained by providing a plurality of monolithic microwave ICs (hereinafter referred to as MMICs) 14 and other components on a package substrate 3 which is formed from a high temperature co-fired ceramic having a dielectric property, such as aluminum nitride. This embodiment of the multi-chip-module 1 may utilize not only microwaves but also other electromagnetic waves ranging from the microwave band to the millimeter-wave band.

The package substrate 3 of the LCC package 2 has a blind rectangular cavity open in its back surface. The package substrate 3 also has a microstrip antenna 5 provided on its front surface portion above the rectangular cavity 4.

The package substrate 3 further has a plurality of through via holes 6 provided in a tubular fashion around the rectangular cavity. The rectangular cavity 4, the microstrip antenna 5 and the through holes 6 together constitute a waveguide part 7. The waveguide part 7 has the same longitudinal and transversal dimensions as those of a tubular waveguide coupled to it. The through via holes 6 constituting the waveguide part 7 are each held in a buried fashion in the dielectric ceramic of the package substrate 3. The longitudinal and transversal dimensions of the rectangular cavity are set to be smaller by 0.3 to 1.0 mm than those of the tubular waveguide.

The through via holes 6 are spaced apart at an interval, which is sufficiently small compared to one half the wavelength of an electromagnetic wave guided by the waveguide when the wave is propagated through the dielectric ceramic of the package substrate 3. Where the dielectric constant ∈r of the dielectric ceramic is 9 when an electromagnetic wave at a frequency of 30 GHz is propagated, the one half wavelength of the electromagnetic wave propagated through the dielectric ceramic is about 1.7 mm. In this case, the through holes 6 are space apart at an interval of about 1/8 to 1/5 of the one half wavelength of the wave, i.e., 0.2 to 0.3 mm.

On the back surface of the package substrate 3 a grounding layer 10a is formed, and on the back surface thereof a high frequency circuit layer 8 having a high frequency circuit of a thin film conductor formed by a deposition or photolithographic process. The package substrate 3 further internally has a wiring layer 9 provided above the back surface grounding layer 10a, for DC bias supply and intermediate frequency signal transmission, and another grounding layer 10b provided above the wiring layer 9. The package substrate 3 in this embodiment thus has a four-layer conductive layer laminate. The package substrate 3 further has a plurality of LCC electrodes 11 provided on its side surfaces and connected to the wiring layer 9.

In the high frequency circuit of the high frequency circuit layer 8, a microstrip line is formed as a high frequency line by the dielectric ceramic between the high frequency circuit layer 8 and the grounding layer 10b and the grounding layer 10b. The internal layer wiring lines formed from the wiring layer 9 and the grounding layer 10b, are high frequency shielded (or isolated) by through via,holes 12 which connect the internal layer wiring lines formed from the layers 9 and 10b. The grounding layer 10b has an escape hole 10c for preventing the through via holes 12 connecting the wiring layer 9 and the high frequency circuit layer 8 from being in conduction to the grounding layer 10b.

The front surface of the package substrate 3 has a plurality of recesses 13 as deep as to expose the surface of the grounding layer 10b. In the recesses 13, MMICs 14, circulators 15 and isolators (not shown) formed by using such semiconductor as GaAs or. InP are accommodated such that they are soldered to the grounding layer 10b. The MMICs 14 are each connected by bonding wires 14a to the high frequency circuit of the high frequency circuit layer 8. The recesses 13 accommodating the circulators 15 each have a recess 13a as deep as to expose the surface of the wiring layer 9. In the recess 13a, a magnetic member 16 of a magnetic material, such as Fe—Ni—Co, is accommodated and secured in position by an adhesive or a solder.

In the package substrate 3, the rectangular cavity 4, the microstrip antenna 5 and the waveguide part 7 together constitute an electromagnetic wave converter 17, which leads an electromagnetic wave having been guided by the waveguide to the microstrip line or conversely leading an electromagnetic wave having been propagated along the microstrip line to the waveguide.

Figure 2:
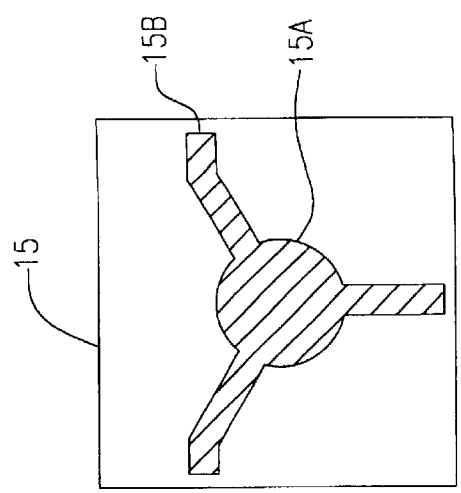
FIG. 2 is a plan view showing the substrate type circulator shown in FIG. 1.

The substrate type circulator 15 shown in FIG. 1 will now be described with reference to FIG. 2. FIG. 2 is a plan view showing the substrate type circulator shown in FIG. 1.

As shown, the substrate type circulator 15 used in this embodiment comprises a central circular microstrip conductor portion 15a and a plurality of micro strip conductive portions 15b extending from the central portion 15a.

Referring back to FIG. 1, this embodiment of the multi-chip-module 1 comprises a lid 18, which serves as a shield member for electromagnetically shielding and hermetically sealing the high frequency circuit and various function elements formed in the high frequency circuit layer 8 of the package module 3.

The lid 18 is formed from a non-magnetic metal, such as tungsten. The back side of the lid 18 has recesses 18a, which are formed in portions corresponding to the high frequency circuit and the function elements in the high frequency circuit layer 8 when the lid 18 is bonded to the package substrate 3, and shield walls 18b partitioning the recesses 18a from one another. When the lid 18 is bonded to the package substrate 3, the shield walls 18b electromagnetically shield and hermetically seal the function elements, such as oscillators and amplifiers, provided in the high frequency circuit layer 8 of the package substrate 3 from one another.

Of the recesses 18a formed in the lid 18, the one 18a covering the substrate type circulator 15 has a recess 18c, which accommodates a permanent magnet 19 disposed above the circular microstrip conductor portion 15a of the substrate type circulator 15. The permanent magnet 19 is held in the recess 18c such that it is bonded by an adhesive or the like. The ceiling of the recess 18a covering the electromagnetic wave exchange circuit 17 serves as a waveguide short-circuit surface.

In addition, since the lid 18 is formed from non-magnetic material, it does not cause oscillative deterioration of the magnetic circuits such as of the substrate type circulator 15 and isolators. Furthermore, with the soft magnetic member 16 provided beneath the substrate type circulator 15 and the permanent magnet 19 provided above the substrate type circulator 15, almost all the magnetic force lines from the permanent magnet 19 are directed toward the soft magnetic member 16, and a uniform static magnetic field is applied to the substrate type circulator 15 in a direction in perpendicular to the surface of the substrate type circulator 15.

Figure 3:
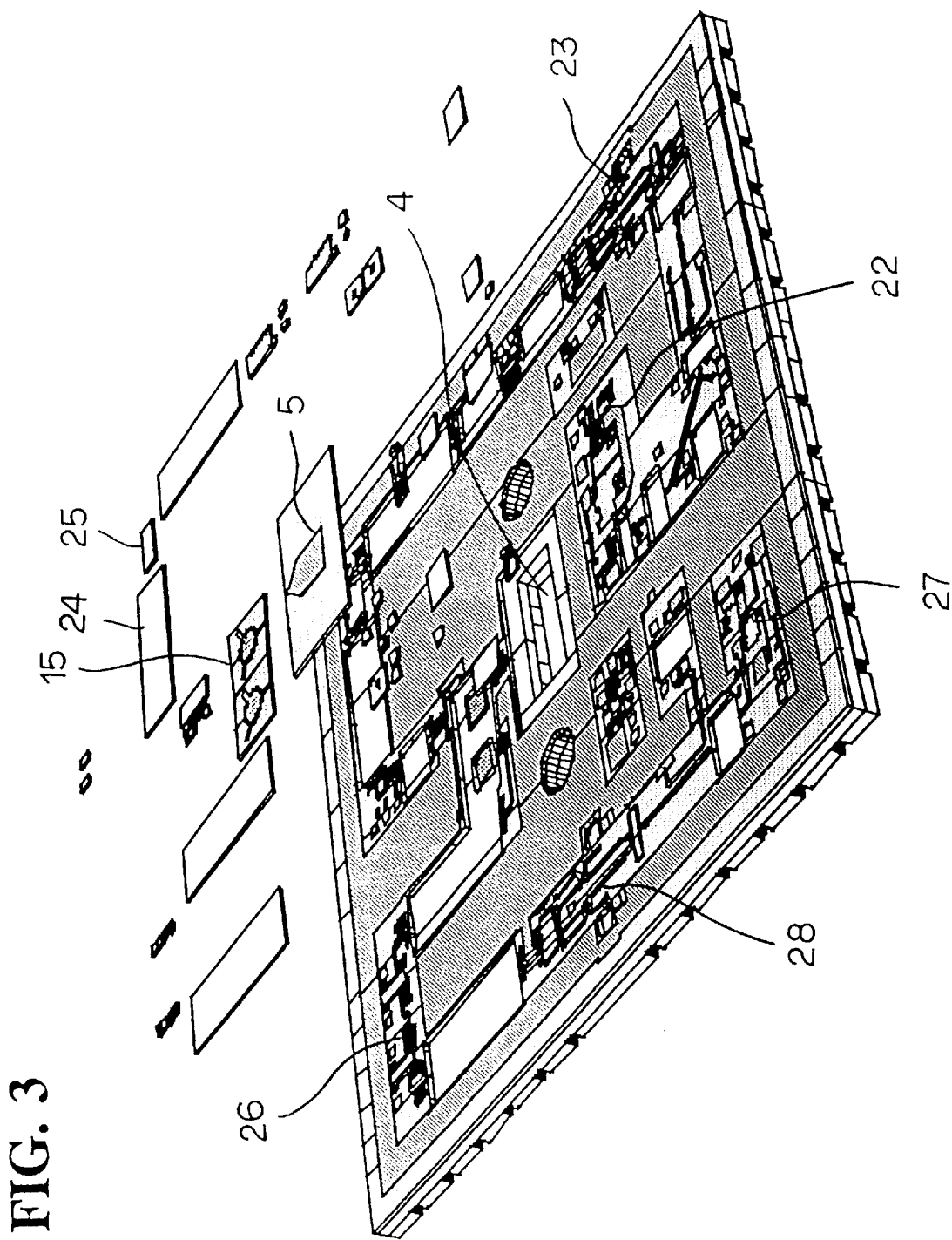
FIG. 3 is a perspective view showing the LCC package of the multi-chip-module shown in FIG. 1 with some of the structure shown separately.

FIG. 3 is a perspective view showing the LCC package of the multi-chip-module shown in FIG. 1 width some of the structure shown separately.

As shown in FIG. 3, the LCC package 2 of the multi-chip-module 1 includes a transmitting part oscillator 22 serving as a function element of a transmitting part for oscillating a transmitting station signal, a transmitting part mixer 23 for generating a radio signal according to an intermediate frequency signal externally inputted via the LCC electrodes 11 and the transmitting station signal note before, a substrate type band-pass filter 24 for suppressing the transmitting station signal and unnecessary waves, and an MMIC amplifier 25 for amplifying the radio signal. Provided as function elements of a receiving part are a low noise amplifier 26 for amplifying a received signal halving been inputted to the multi-chip-module 1 by being guided along the waveguide, a receiving part oscillator 27 for oscillating a receiving station signal, and a receiving part mixer 28 for generating an intermediate wave signal according to the received signal having been amplified by, the low noise amplifier 26 and the receiving station signal. The above function elements are constituted by MMICs.

Figure 4:
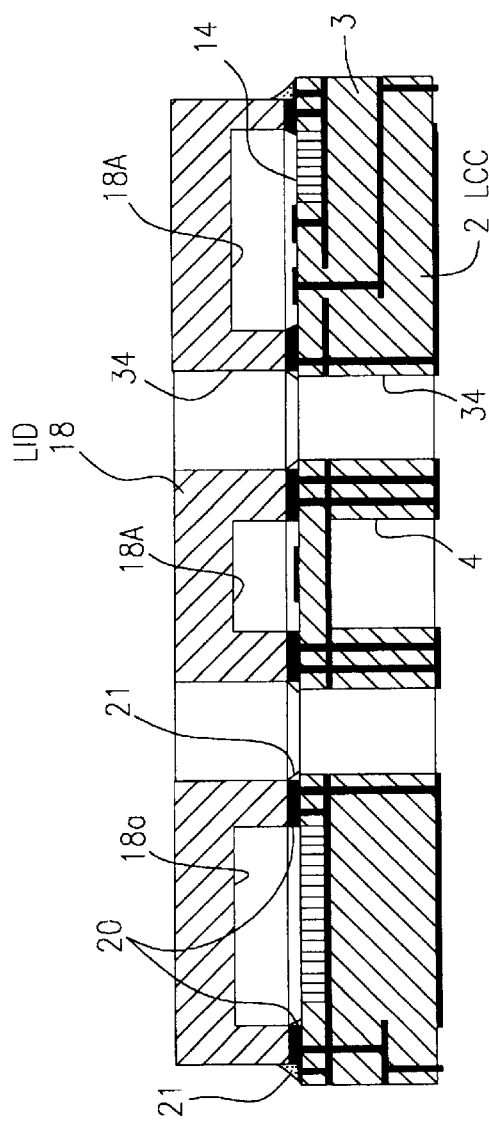
FIG. 4 is a sectional view showing the multi-chip-module shown in FIG. 1 in a state that the LCC package and the lid are bonded together.

FIG. 4 is a sectional view showing the multi-chip-module shown in FIG. 1 in a state that the LCC package and the lid are bonded together.

As shown in FIG. 4, the lid 18 and the package substrate 3 are bonded together by a conductive adhesive 20 or a solder applied to the bonding surfaces of the lid 18 and the package substrate 3. The surface of the package substrate 3 and the edges of the lid 18 are hermetically sealed to one another by fillets of moisture-resistant resin 21 or a solder with a water absorption factor of about 0.2% or below. The multi-chip-module 1 is obtained in the manner as described. The multi-chip-module 1 thus obtained has cavities defined by the recesses formed in the lid 18 and the package substrate 3, and the high frequency circuit and the various function elements are electromagnetically shielded and hermetically sealed relative to one another.

Figure 5:
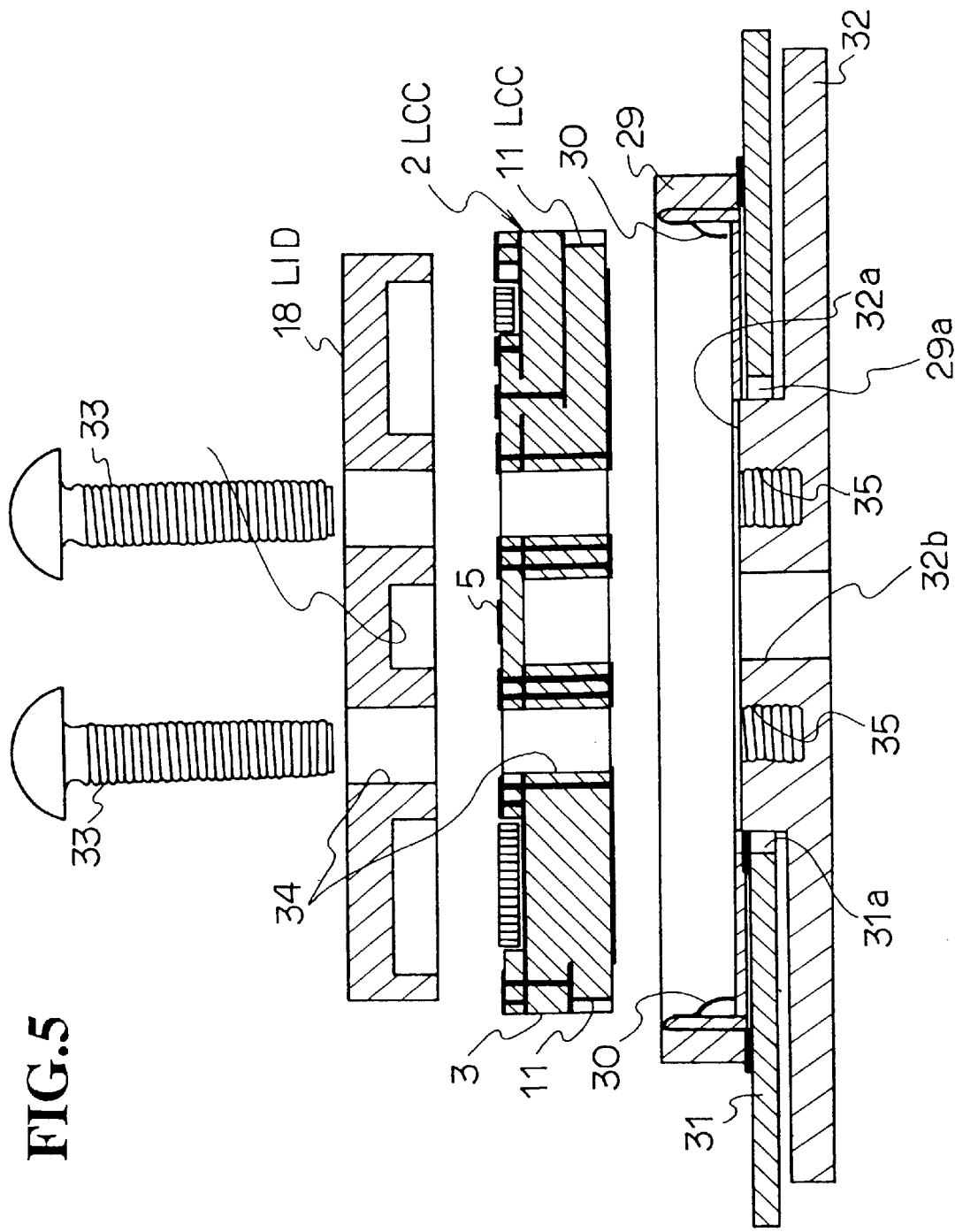
FIG. 5 is an exploded sectional view showing the multi-chip-module shown in FIG. 1 together with a printed circuit board and a mother board and so forth, in which the multi-chip-module is mounted.
Figure 6:
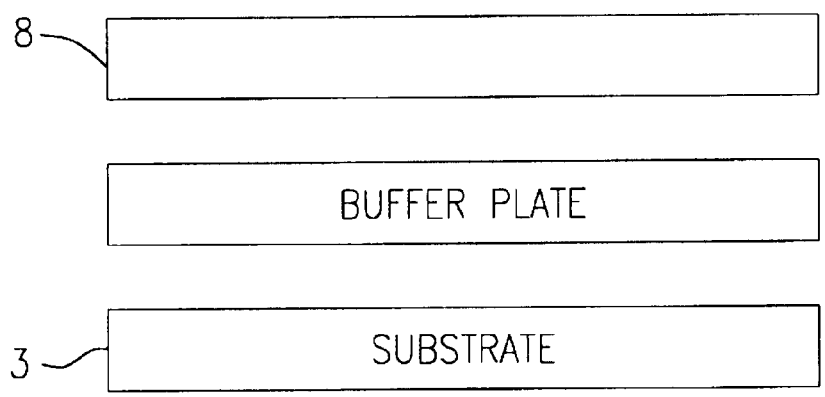
FIG. 6 is an exploded view showing some of the components of the multi-chip-module, including a buffer plate.

FIG. 5 is an exploded sectional view showing the multi-chip-module shown in FIG. 1 together with a printed circuit board and a mother board and so forth, in which the multi-chip-module is mounted.

As shown in FIG. 5, the multi-chip-module 1 having the construction as described above is mounted in a receptacle 29 having a plurality of flexible connector electrodes 30 connected to the LCC electrodes 11. The receptacle 29 is mounted by a solder re-flow on the printed circuit board 31 which serves as a mounting board. When the receptacle 29 is mounted, its connector electrodes 30 are connected via connection terminals led out from the connector electrodes 30 and the re-flow solder to the wiring of the printed circuit board 31. The printed circuit board 31 and the receptacle 29 have a hole 29a or 31a, respectively, which are penetrated by a boss or a projection 32a of the mother board 32 to be described later. On the printed circuit board 31, other surface mounting parts are also mounted by the solder re-flow.

The printed circuit board 31 with the receptacle 29 mounted thereon is secured by bolts 33 to the mother board 32 as a support member made of a metal. The lid 18 and the package substrate 3 of the multi-chip-module 1 thus have bolt holes 34, through which the bolts 33 are inserted. The bolt holes 34 formed in the lid 18 have a diameter greater by 0.1 to 0.5 mm than the diameter of those formed in the package substrate 3.

The mother board 32 has a boss of a projection 32a, which is inserted in the holes 29a and 31a of the printed circuit board 31 and the receptacle 29 and has its top surface held in contact with the back surface of the package substrate 3. The projection 32a of the mother board 32 has a rectangular hole 32b facing the rectangular cavity 4 of the multi-chip-module 1 and functioning as part of the tubular waveguide. The projection 32a of the mother board 32 also has threaded holes 35, in which bolts 33 are screwed.

With the above construction, in the multi-chip-module 1 a portion near the rectangular hole of the rectangular cavity 4 is bonded to the mother board 32. Thus, the angular cavity 4 of the multi-chip-module 1 and the rectangular hole 32b of mother board 32 can be reliably coupled to each other irrespective of slight warping, of the order of 20 μm, produced in the package substrate 3.

The operation of the embodiment of the multi-chip-module 1 having the above construction will now be described.

First, the operation when an electromagnetic wave is propagated from the multi-chip-module 1 to the external waveguide will be described.

The transmitting station signal from the transmitting part oscillator 22 of the LCC package 22 is inputted to the transmitting part mixer 23. Also, the intermediate wave signal transmitted from the printed circuit board 31 via the receptacle 29 to the LCC electrodes 11 of the LCC package 2, is inputted via the wiring layer 9 of the package substrate 3 to the transmitting part mixer, 23. The transmitting part mixer 23 generates a radio signal according to the input transmitting station signal and intermediate wave signal. The radio signal is passed through the substrate type band-pass filter 24, then amplified in the MMIC amplifier 2, and then transmitted via the substrate type circulator 15 used commonly for the transmission and reception to the microstrip antenna 5. When the radio signal passes through the substrate type band-pass filter 24, transmitting station signal and other unnecessary signals are removed. The radio signal having been transmitted to the microstrip antenna 5 is emitted via the electromagnetic wave converter 17 to the waveguide part 7 and the rectangular hole 32b coupled to the angular waveguide, and propagated along the external waveguide (not shown) coupled to the multi-chip-module 1.

The operation for receiving the received signal having been propagated through the external waveguide by the multi-chip-module 1 will now be described.

The received signal having been propagated through the external waveguide, is further transmitted through the rectangular hole 32b of the mother board 32 and the waveguide part 7 of the LCC package, and is inputted to the electromagnetic wave converter 17. The received signal inputted to the electromagnetic wave converter 17 is inputted via the microstrip antenna 5, the substrate type circulator 15 and the substrate type band-pass filter 24 to the low noise amplifier 26 for amplification. The amplified signal from the low noise amplifier 26 is inputted to the receiving part mixer 26. To the receiving part mixer 28 is also inputted the receiving station signal from the. receiving part oscillator 27. The receiving part mixer 28 generates the intermediate wave signal according to the input amplified received signal and receiving station signal. The generated intermediate frequency signal passes through the wiring layer 9 of the package substrate 3, and is led from the LCC electrodes 11 of the LCC package 2 via the receptacle 29 to the printed circuit board 31.

Heat generated in the MMICs 14 is conducted through the projection 32a of the mother board 32 in contact with the package substrate 3 and radiated from the mother board 32 to the outside.

Since this embodiment of the multi-chip-module 1 has the structure that the lid 18 having a plurality of recesses is bonded to the LCC package 2, the electromagnetic shielding and hermetical sealing of the individual function elements of the high frequency circuit tone another is obtainable in a single bonding step. Thus, it is possible to simplify the lid bonding process and also improve the yield of hermetical sealing in the lid bonding process compared to the prior art process, in which a plurality of lids are bonded.

In addition, in the multi-chip-module 1 the LCC electrodes 11 provided on the side surfaces of the LCC package 2 are connected to the connector electrodes 30 of the receptacle 29 mounted on the printed circuit board 31. Thus, even when the multi-chip-module 1 is expanded due to heat generation from the MMICs 14 and other components, the connection of the LCC electrodes 11 and the connector electrodes 22 to one another can be maintained owing to the absorption of the expansion by flexing of the flexible connector electrodes 30. It is thus possible to improve the reliability of connection of the multi-chip-module 1 and the mounting substrate to one another, and, unlike the prior art, it is not possible that the portions where the multi-chip-module and the mounting substrate are connected to each other, is ruptured by an ambient temperature change. A multi-chip-module 1 having as large size as 20 mm or above thus can be realized.

While the multi-chip-module 1 described above used aluminum nitride as the ceramic material of the package substrate 3, it is also possible to use other materials which have as high thermal conductivity as about 20 W/m·K or above and are capable of permitting multi-layer substrate structure formation, for instance beryllia and silicon nitride.

Also, while the multi-chip-module 1 described above had a structure that the microstrip antenna 5 is provided on the front surface of the package substrate 3 over the rectangular cavity 4 of the non-penetrating type open in the back surface, it may also have a different structure, for instance one which is obtained by forming the package substrate 3 with a rectangular cavity of penetrating type and bonding a dielectric ceramic substrate with a microstrip antenna formed on the front opened surface with an adhesive or by soldering to the front surface portion of the package substrate 3 with the rectangular cavity open therein. As a further alternative, it is possible to form a microstrip antenna by forming a ceramic package with a non-penetrating cavity (or waveguide part), which is open in the top surface and has a bottom constituted by a lowermost non-conductive dielectric layer, and arranging a separate dielectric substrate such as to project into the waveguide part along the side surfaces thereof.

As has been described in the foregoing, in the microwave integrated circuit multi-chip-module according to the present invention, to a package having a high frequency transmission line is formed on the surface and carrying a plurality of microwave integrated circuits, is bonded a shielding member, which has recesses formed such as to face the high frequency transmission line and each of the microwave integrated circuits and shielding wall portions partitioning the recesses from one another. It is thus possible to electromangetically shield the high frequency circuit and each of the microwave integrated circuit from one another with a single shielding member, thus simplifying the process of bonding the shielding member.

In addition, by hermetically sealing the surface of the package substrate and the outer periphery of the shielding member from each other with fillets of a water-resistant resin or a solder, it is possible to improve the yield of the hermetically sealing.

Furthermore, the microwave integrated circuit multi-chip-module mounting structure according to the present invention comprises a microwave integrated circuit multi-chip-module with external connection electrodes provided on the side face of a package substrate and a mounting substrate having a receptacle member with the microwave integrated circuit multi-chip-module mounted therein, the receptacle member being provided with flexible connector terminals connected to the external connection terminals. Even when microwave integrated circuit multi-chip-module is inflated by heat generation in the microwave integrated circuits, the connection between the external connection electrodes and the connector electrodes are maintained, and it is thus possible to improve the reliability of the connection between the microwave integrated circuit multi-chip-module and the mounting substrate.

In the present invention, a buffer plate such as Cu/W buffer plate may be inserted between the package substrate (AlN) and the high frequency circuit portion (GaAs) in order to reduce the mechanical stress caused to the high frequency circuit portion due to the difference of the temperature expansion coefficients therebetween.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A microwave integrated circuit multi-chip-module comprising a package substrate having a high frequency transmission line suited for transmitting microwave signals formed on a surface of said substrate, a plurality of microwave integrated circuits mounted thereon, a tubular waveguide part for guiding electromagnetic waves inputted to or outputted from the high frequency transmission line and a shielding member bonded to the surface of the package substrate and electromagnetically shielding the high frequency transmission line and each microwave integrated circuit from each other, wherein:

the shielding member has recesses formed to face the high frequency transmission line and the microwave integrated circuits and shielding wall portions partitioning the recesses from one another.

2. The microwave integrated circuit multi-chip-module according to claim 1, wherein the surface of the package substrate and the outer periphery of the shielding member are hermetically shielded from each other by fillets made of a water-resistant material; or a solder.

3. The microwave integrated circuit multi-chip-module according to claim 2, wherein the waveguide part has a plurality of via holes formed at spaced intervals in a tubular fashion in the package substrate.

4. The microwave integrated circuit multi-chip-module according to claim 1, wherein the waveguide part has a plurality of via holes formed in a predetermined interval in a tubular fashion in the package substrate.

5. The microwave integrated circuit multi-chip-module according to claim 1, wherein the package substrate is made of aluminum nitride, beryllia or silicon nitride.

6. The microwave integrated circuit multi-chip-module according to claim 1, wherein a buffer plate is inserted between the package substrate and plurality of microwave integrated circuits the in order to reduce the mechanical stress caused to the plurality of microwave integrated circuits due to the difference of the temperature expansion coefficients.

7. A mounting structure for mounting a microwave integrated circuit multi-chip-module comprising a package substrate having a high frequency transmission line suited for transmitting microwave signals formed on the surface, a plurality of microwave integrated circuits mounted thereon, and a shielding member bonded to the surface of the package substrate and electromagnetically shielding the high frequency transmission line and each microwave integrated circuit form each other, wherein:

and a mounting substrate with the microwave integrated circuit multi-chip-module mounted therein, wherein:

the side surfaces of the module of the microwave integrated circuit module have external connection electrodes connected to the microwave integrated circuits, and the mounting substrate has a receptacle member with the microwave integrated circuit multichip-module mounted therein and having flexible connector terminals connected to the external connection electrodes of the microwave integrated circuit multi-chip-module.

8. The mounting structure of the microwave integrated circuit multi-chip-module according to claim 7, wherein at least a portion of parts of the mounting substrate and the receptacle member that face the microwave,integrated circuit multi-chip-module when the microwave integrated circuit multi-chip-module is mounted in the receptacle member, has an opening, a projection formed in a support, member with the microwave integrated circuit multi-chip-module mounted therein being inserted through the opening.

9. The mounting structure according to claim 7 wherein the package substrate is made of aluminum nitride, beryllia or silicon nitride.

10. The mounting structure according to claim 7, wherein a buffer plate is inserted between the package substrate and the multi-chip-module in order to reduce the mechanical stress caused to the plurality of microwave integrated circuits due to the difference of the temperature expansion coefficients.

11. A microwave integrated circuit multi-chip-module comprising a package substrate of a co-fired ceramic of a dielectric property including a plurality of high frequency circuit portions formed on the surface, a tubular waveguide part for guiding electromagnetic waves inputted to or outputted from the high frequency circuit portions and a shielding member of a non-magnetic metal having plurality of recesses formed in position corresponding to the respective high frequency circuit portions, the package substrate and the shielding member being bonded for electromagnetically shielding the high frequency circuit portions.

12. The microwave integrated circuit multi-chip-module according to claim 11, wherein the shielding member is made of tungsten.

13. The microwave integrated circuit multi-chip-module according to claim 11, wherein the package substrate and the shielding member being bonded together by a conductive adhesive or a solder.

14. The microwave integrated circuit multi-chip-module according to claim 11, wherein surface of the package substrate and edge of the shielding member are hermetically sealed to one another by fillets of moisture-resistant resin or a solder.

15. The microwave integrated circuit multi-chip-module according to claim 11, wherein the package substrate is made of aluminum nitride, beryllia or silicon nitride.

16. The microwave integrated circuit multi-chip-module according to claim 11, wherein a buffer plate is inserted between the package substrate and the high frequency circuit portion in order to reduce the mechanical stress caused to the high frequency circuit portion due to the difference of the temperature expansion coefficients.

17. A mounting structure for mounting a microwave integrated circuit multi-chip-module comprising a package substrate of a co-fired ceramic of a dielectric property including a plurality of microwave circuit portions formed on the surface, a shielding member of a non-magnetic metal having plurality of recesses formed in position corresponding to the respective microwave circuit portions, the package substrate and a plurality of leadless chip carrier electrodes, the shielding member being bonded for electromagnetically shielding the high frequency circuit portions; and a receptacle having a plurality of flexible connector electrodes each connected to a corresponding leadless chip carrier electrode.

18. The mounting structure according to claim 17, wherein the leadless electrodes is mounted by a solder re-flow on a printed circuit board as amounting board.

19. The mounting structure according to claim 17, wherein the leadless electrodes is mounted by a solder re-flow on a printed circuit board as a mounting board and the printed circuit board is secured a mother board as a support member of a metal.

20. The mounting structure according to claim 17, wherein the leadless electrodes is mounted by a solder re-flow on a printed circuit board as a mounting board, the printed circuit board is secured a mother board as a support member of a metal, and the projection of the mother board has a rectangular hole facing rectangular cavity formed in the multi-chip-module functioning as part of the tubular waveguide.

21. The mounting structure according to claim 17, wherein the package substrate is made of aluminum nitride, beryllia or silicon nitride.

22. The mounting structure according to claim 17, wherein a buffer plate is inserted between the package substrate and the high frequency circuit portion in order to reduce the mechanical stress caused to the high frequency circuit portion due to the difference of the temperature expansion coefficients.

23. A mounting structure for mounting a microwave integrated circuit multi-chip-module comprising a package substrate having a high frequency transmission line formed on a surface of said substrate, a plurality of microwave integrated circuits mounted thereon, and a shielding member bonded to the surface of the package substrate for electromagnetically shielding the high frequency transmission line and each microwave integrated circuit from each other, and a mounting substrate with the microwave integrated circuit multi-chip-module mounted therein, wherein:

the side surfaces of the package of the microwave integrated circuit module has external connection electrodes connected to the microwave integrated circuits, and the mounting substrate has a receptacle member with the microwave integrated circuit multi-chip-module mounted therein and having a flexible connector terminals connected to the external connection electrodes of the microwave integrated circuit multi-chip-module.

24. The mounting structure of the microwave integrated circuit multi-chip-module according to claim 23, wherein at least a portion of parts of the mounting substrate and the receptacle member that face the microwave integrated circuit multi-chip-module when the microwave integrated circuit multi-chip-module is mounted in the receptacle member, has an opening, a projection formed in a support member with the microwave integrated circuit multi-chip-module mounted therein being inserted through the opening.

25. The mounting structure according to claim 23, wherein the package substrate is made of aluminum nitride, beryllia or silicon nitride.

26. The mounting structure according to claim 23, wherein a buffer plate is inserted between the package substrate and the high frequency circuit portion in order to reduce the mechanical stress caused to the high frequency circuit portion due to the difference of the temperature expansion coefficients.

* * * * *